United States Patent [19]

Rosbeck et al.

[11] Patent Number: 4,639,756
[45] Date of Patent: Jan. 27, 1987

[54] GRADED GAP INVERSION LAYER PHOTODIODE ARRAY

[75] Inventors: Joseph P. Rosbeck, Goleta; Ichiro Kasai, Santa Barbara, both of Calif.

[73] Assignee: Santa Barbara Research Center, Goleta, Calif.

[21] Appl. No.: 859,674

[22] Filed: May 5, 1986

[51] Int. Cl.[4] .................. H01L 27/14; H01L 31/12; H01L 31/00; H01L 29/06
[52] U.S. Cl. .................................. 357/30; 357/16; 357/32; 357/55; 357/45; 357/61
[58] Field of Search .................. 357/30, 32, 45, 55, 357/16, 52, 61

[56] References Cited

U.S. PATENT DOCUMENTS

| | | | |
|---|---|---|---|
| 4,110,778 | 8/1978 | Eden et al. | 357/30 |
| 4,183,035 | 1/1980 | Wang | 357/16 |
| 4,206,003 | 6/1980 | Koehler | 357/30 |
| 4,411,732 | 10/1983 | Wotherspoon | 357/30 |
| 4,447,291 | 5/1984 | Schulte | 357/30 |
| 4,494,133 | 1/1985 | Dean et al. | 357/16 |

Primary Examiner—Martin H. Edlow
Assistant Examiner—Jerome Jackson
Attorney, Agent, or Firm—Ronald L. Taylor; A. W. Karambelas

[57] ABSTRACT

A HgCdTe photodiode array for detecting mid-wavelength infrared radiation has a laminated structure consisting of a substrate, a heavily doped wide bandgap buffer layer, and a more lightly doped narrow bandgap base layer. Two sets of a orthogonally disposed U-shaped grooves are etched completely through the base layer and partially through the buffer layer, thereby forming a plurality of mesa-shaped structures. Overlying the portion of base layer contained within each mesa is a capping layer of opposite conductivity. The junction of the base and capping layer within each mesa forms a photodiode. In contact with each capping layer is a metalization area for connection of the underlying diode to a readout device. In contact with the buffer layer is another metalization layer for making a common electrical connection to the array of photodiodes. Overlying the mesa surfaces is a layer of passivation which contains a fixed positive charge. The charge creates an inversion layer within the surface of the base layer exposed along the mesa walls, thereby enlarging the p-n junction of each photodiode. Radiation impinging on a lower surface of the transparent substrate passes through the substrate and into the buffer layer, which is also transparent. Transmitted through the buffer layer, the radiation is absorbed within that portion of the base layer contained within each mesa, resulting in the generation of diode currents.

17 Claims, 2 Drawing Figures

INCIDENT INFRARED RADIATION

INCIDENT INFRARED RADIATION

GRADED GAP INVERSION LAYER PHOTODIODE ARRAY

BACKGROUND OF THE INVENTION

This invention relates to infrared photodiode array detectors and, more particularly, to a mercury-cadmium-telluride photodiode array detector having a plurality of mesas etched into layers of compositionally graded material, and an overlying layer of surface passivation which has a fixed positive charge.

An infrared photodiode array detector is used to convert incident infrared radiation to a detectable electrical current. Typically such an array is composed of a number of individual photodiodes arranged in a linear or two dimensional matrix. The magnitude of the current generated by each of the diodes within the array is in direct relation to the flux density of the incident infrared radiation impinging upon each of the diodes.

HgCdTe photodiode arrays are typically composed of a mercury-cadmium-telluride base layer which is uniformly doped with a substance suitable to give the base layer the characteristics of a p-type semiconductor material. Within a surface of this p-type base layer are then formed a number of n-type semiconductor regions. The interface of each n-type region with the p-type base layer results in the formation of a p-n diode junction. A current is caused to flow through each diode junction by charged photocarriers which are produced when the base layer absorbs incident infrared radiation. These photocarriers diffuse to the diode p-n junction, resulting in a diode current.

A particular problem with this type of photodiode array is that the surface of the base layer surrounding the p-n junction can create a diode leakage current. This leakage current flows even when no radiation is incident upon the array, resulting in what is commonly called dark current. The dark current adversely affects the signal-to-noise ratio of the photodiode array.

Some prior photodiode arrays, in an attempt to reduce the leakage current, utilize a field plate to control the base layer surface potential. However, this approach creates a problem in that a metalization procedure is required to fabricate the field plate. The metalization procedure results in an array which is more difficult and costly to manufacture. The use of a field plate also has the disadvantage of requiring an external voltage source to properly bias the plate.

Another problem with previous HgCdTe arrays arises from the inherent compositional uniformity of the base layer material. Because the ratio of mercury to cadmium is essentially constant throughout the base layer, and the entire base layer is of one energy bandgap and hence, capable of absorbing radiation. Thus charged photocarriers can be created anywhere within the base layer. It can be seen, therefore, that photocarriers are free to travel within the base layer in any given direction. Thus, a photocarrier which is created between two neighboring diodes is free to travel to either, resulting in the problem known generally as crosstalk between diodes. Excessive crosstalk can detrimentally affect the signal-to-noise ratio of the array, with a consequent impairment of the clarity of the image as viewed by the array.

In order to compensate for the reduction in the signal-to-noise ratio caused by surface leakage and crosstalk, previous photodiode arrays often utilize higher impurity doping levels. This is done in an attempt to reduce surface leakage effects and minimize crosstalk.

The use of higher doping levels, however, creates an additional problem in that the useable lifetime of the semiconductor material is reduced, which may cause a reduction in the conversion efficiency of the array. In addition, leakage current across the diodes within the array may increase, resulting in an increase in the dark current. A higher doping level may also cause a detrimental increase in the junction capacitance of each diode, with a corresponding decrease in the signal-to-noise ratio of the photodiode array when coupled to a readout device.

SUMMARY OF THE INVENTION

The foregoing problems are overcome and other advantages are provided by a photodiode imaging array which, in accordance with the invention, has a plurality of mesas etched into layers of compositionally graded semiconductor material. Overlying these mesas is a layer of passivation which contains a fixed positive charge.

In one embodiment of the invention, an array of mesas is created in a laminated semiconductor structure comprising a base layer and an underlying buffer layer which are supported by a base layer. The mesas are formed by etching completely through the base layer of lightly doped p-type HgCdTe and partially through the underlying buffer layer of more heavily doped p-type HgCdTe. The relative proportions of Hg to Cd within the base layer and the buffer layer are varied such that the buffer layer has a wide energy bandgap and is therefore transparent to radiation of a desired wavelength while the base layer has a narrow energy bandgap for absorbing the radiation. In each mesa there is a capping layer of n-type HgCdTe disposed on the top of the base layer. The absorption of radiation by the base layer results in the generation of photocarriers which diffuse to the capping layer. In each mesa, the interface of the base layer and the capping layer constitutes a photodiode.

In contact with the upper surface of each capping layer is an area of contact metalization suitable for connecting the underlying diode to a readout device. A second area of contact metalization is in contact with the heavily doped and hence electrically conducting buffer layer. This second metalization area provides for a common electrical connection with all of the diode elements of the array.

Surrounding the diode contact metalization and completely covering the mesa surfaces is the layer of passivation which contains a fixed positive charge. The positive charge within the passivation layer causes the underlying surface of the lightly doped p-type base layer to invert. However, the surface of the more heavily doped buffer layer, also in contact with the passivation, does not invert.

The substrate underlying the structure described above is composed of a layer of CdTe or CdZnTe which functions as an electrical insulator. The substrate layer is also transparent to infrared radiation of a wavelength that is to be detected, the radiation being allowed to enter the array through a bottom surface of the substrate layer.

BRIEF DESCRIPTION OF THE DRAWINGS

The invention will now be described by reference to the following drawings and description in which like elements have been given common reference numbers, wherein.

DETAILED DESCRIPTION

Figure 1:
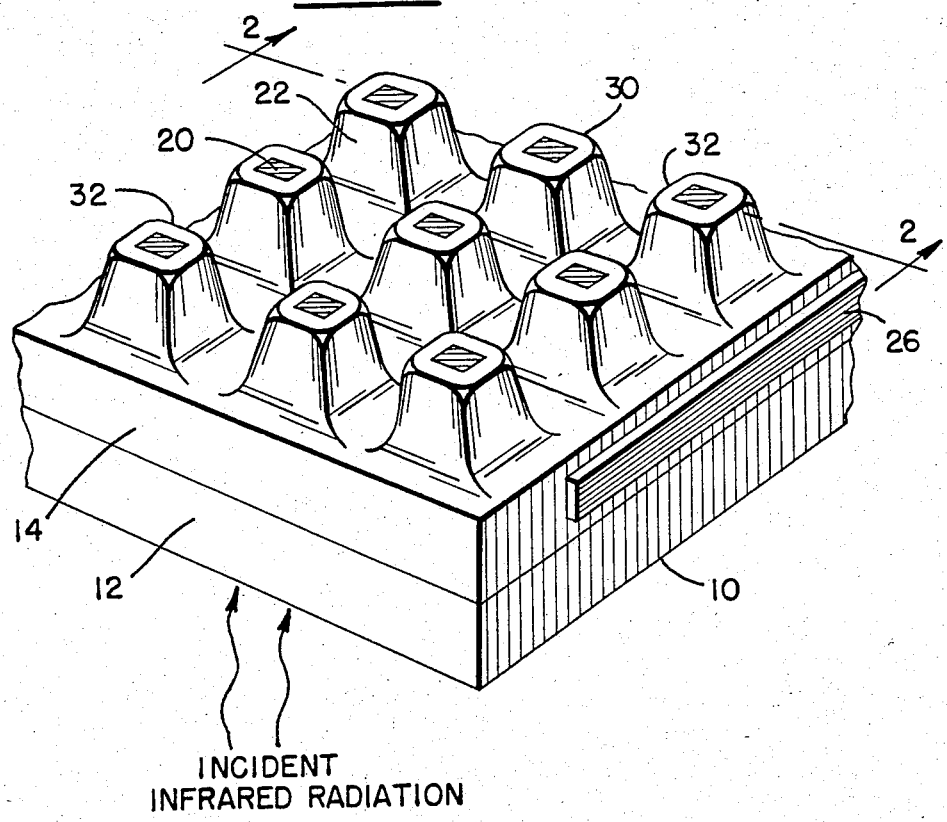
FIG. 1 is a stylized perspective view showing a photodiode array having layers of compositionally graded material and a passivation layer containing a fixed positive charge in accordance with an embodiment of the invention.
Figure 2:
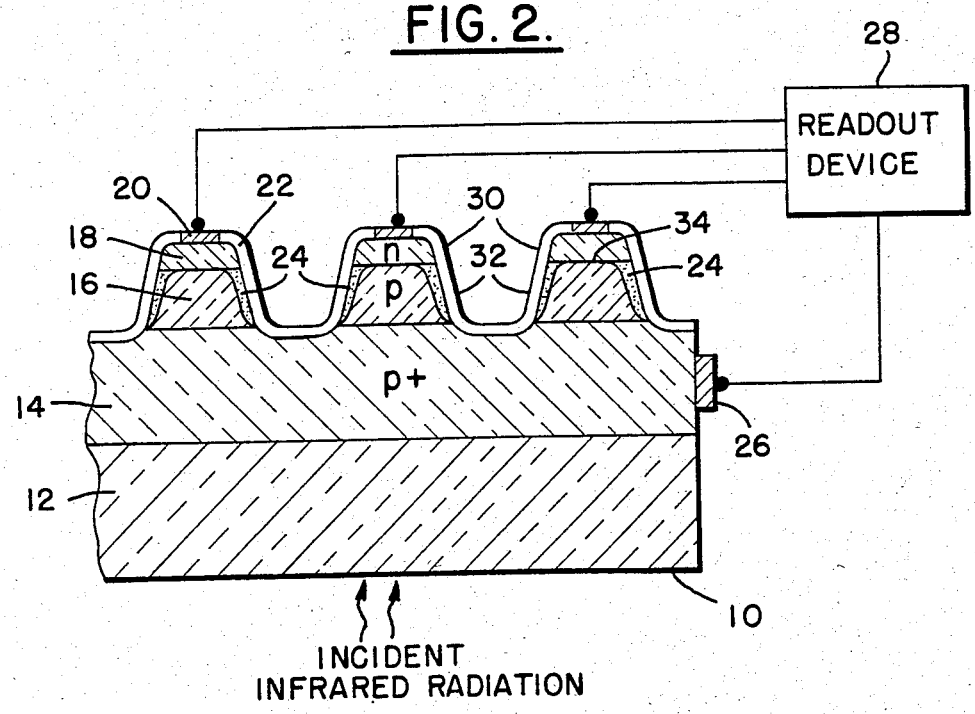
FIG. 2 is a sectional view of the photodiode array taken in section along line 2—2 of FIG. 1.

With reference to FIGS. 1 and 2 there is shown an exemplary photodiode array 10. The array 10 is intended to be particularly sensitive to mid-wavelength infrared radiation. Generally, mid-wavelength infrared radiation is considered to be of frequencies corresponding to a wavelength range of approximately 3 to 6 microns.

It should be realized, however, that the teaching of invention may be utilized to construct photodiode arrays which are sensitive to radiation of other wavelength ranges. For example, a photodiode array sensitive to radiation having a wavelength range of 8 to 12 microns may be constructed by the use of HgCdTe material having a composition appropriate for absorbing radiation of that wavelength.

The array 10 of this embodiment of the invention comprises a substrate 12, a buffer layer 14, and a base layer 16. Array 10 has the form of mesa regions 30 that extend through the base layer 16 and partially into buffer layer 14. Each mesa includes a capping layer 18. A layer of passivation 22 provides for protecting the mesa surfaces from environmental contaminates. Contained within each mesa is a photodiode which is sensitive to mid-wavelength infrared radiation.

In addition, the aforementioned passivation 22 contains a fixed positive charge which interacts with the underlying surface of base layer 16 to create an inversion layer 24. The inversion layer 24 causes an overall decrease in the surface leakage effects of array 10, resulting in improved performance. Electrical contact is made to array 10 by way of a plurality of diode contact metalization areas 20 and a common contact metalization area 26 which is in contact with the electrically conducting buffer layer 14.

Considering the constituent components in greater detail, array 10 is fabricated on an insulating substrate 12 that is substantially transparent to midrange wavelength infrared radiation. Typically, the substrate 12 consists of CdTe or CdZnTe and has a thickness of approximately 760 microns.

The buffer layer 14 is grown epitaxially on the substrate 12 to a typical thickness of 10 microns. Preferably, layer 14 is comprised of $Hg_{1-x}Cd_xTe$ doped with a p-type acceptor impurity such as arsenic. The number of acceptor atoms per cubic centimeter is approximately $1 \times 10^{16}$, thereby making layer 14 an electrical conductor.

The value of x in the $Hg_{1-x}Cd_xTe$ buffer layer 14 is approximately 0.45. Thus, layer 14 is substantially transparent to infrared radiation of a wavelength greater than approximately 2 microns.

Overlying layer 14 is the base layer 16 which has a typical thickness of 8 microns. Preferably, layer 16 is also comprised of $Hg_{1-x}Cd_xTe$ doped with an p-type acceptor impurity such as arsenic. The concentration of acceptor atoms is typically in the range of $3 \times 10^{15}$ to $5 \times 10^{15}$ atoms per cubic centimeter, which is a lesser concentration than that of the buffer layer 14. This difference in the concentration of acceptor impurity atoms between the buffer layer 14 and the base layer 16 is an important feature of the invention as will be discussed hereinafter.

The value of x in the $Hg_{1-x}Cd_xTe$ base layer 16 is approximately 0.3, thereby making layer 16 of a narrower bandgap than layer 14. Consequently, mid-wavelength infrared radiation which has passed through the substantially transparent base layer 12 and layer 14 is absorbed in layer 16. The absorption of the infrared radiation results in the creation of charged photocarriers within layer 16.

Inasmuch as a stated purpose of the invention is to create an array of photodiodes it is necessary to differentiate the structure as so far described into a plurality of detecting regions, each such differentiated region therein to function as a photodiode within the array 10.

In this embodiment of the invention the differentiation is accomplished by creating a plurality of mesa structures 30 within the base layer 16 and the buffer layer 14. The mesas 30 result from etching two intersecting sets of U-shaped grooves 32, the grooves within a set being equally spaced apart and parallel to one another. The grooves of one set are disposed such that they are substantially orthogonal to the other set. The spacing between adjacent parallel grooves is typically 50 microns. A groove is typically 20 microns wide at its widest point and has a typical depth of 5 microns.

Each U-shaped groove 32 is etched completely through layer 16 and partially through layer 14. Thus the portion of layer 16 contained within each of the resulting mesas 30 is physically isolated from the portion of layer 16 contained within all others of the plurality of mesas 30. This is an important feature of the invention and will be discussed hereinafter.

Overlying the portion of layer 16 contained within each mesa 30 is epitaxially grown the capping layer 18 with a typical thickness of 2 microns. Preferably, capping layer 18 is comprised of $Hg_{1-x}Cd_xTe$ doped with an n-type donor impurity such as Indium. Capping layer 18 contains donor atoms in a typical concentration of $2 \times 10^{16}$ atoms per cubic centimeter. The value of x in the $Hg_{1-x}Cd_xTe$ capping layer 18 is typically 0.3. The interface of layer 16 and the overlying layer 18 forms a p-n diode junction 34. The aforementioned radiation-induced photocarriers that are created within layer 16 diffuse across this junction 34 and into layer 18, resulting in an electric current flow across the diode junction 34.

In order that the diode current may be measured by an appropriate readout device 28, such as an integrated circuit multiplexed, the aforementioned contact metalization 20 is applied such that it overlies a central portion of the top surface of each mesa 30 and hence, the underlying diode junction 34. The metalization 20 is typically comprised of palladium, or of layers of different metals as is well known in the art.

Overlying the exposed surfaces of the plurality of mesas 30 is deposited the aforementioned layer of passivation 22, composed typically of silicon dioxide. Passivation 22 is preferably applied by a photochemical deposition process which results in a permanent positive charge entering the silicon dioxide. Thus the passivation 22 has a permanent positive charge which may be said to be fixed in the passivation 22.

The fixed positive charge within passivation 22 interacts with the base layer 16 at the surfaces disposed beneath passivation 22. This interaction creates an n- type inversion layer 24 within the surface of layer 16 underlying passivation 22. The inversion layer 24 is in contact with the capping layer 18. The surface of buffer layer 14, although also in contact with passivation 22, does not undergo inversion. The amount of fixed positive charge within passivation 22 is of sufficient magnitude to invert the surface of base layer 16 to provide the aforementioned inversion layer 24. The charge is not sufficient, however, to invert the more heavily doped, wider bandgap buffer layer 14. Thus, the inversion layer 24 contained within each mesa 30 is isolated from the inversion layers 24 within the surrounding mesas 30 by the invervening material of layer 14 and passivation 22. As can be readily appreciated, without the intervening material of layer 14 and passivation 22 each of the inversion layers 24 within each of the mesas 30 would be in electrical contact. This contact would render the device unuseable as a photodiode array inasmuch as there would be no differentiation of detecting elements.

The aforementioned area of contact metalization 26 is applied to layer 14. As was previously mentioned, layer 14 is electrically conducting and underlies all of the mesas 30 within the array 10. Therefore the metalization 26 forms a common electrical connection with the plurality of mesas 30. Thus a means is provided for a common connection to be made from array 10 to readout device 28. Metalization 26 is typically of gold, of platinum, or of layers of different metals as is well known in the art.

The aforementioned fixed positive charge within passivation 22, in conjunction with the compositionally graded layer 14 and layer 16 provides the invention with several advantages over prior art HgCdTe photodiode arrays.

One such advantage is that the inversion layer 24 acts to control the surface potential of layer 16, thereby resulting in a reduction of leakage current due to surface states. Thus the beneficial effect of a field plate is created, without the aforesaid disadvantages of a separate metalization layer and an external source of bias voltage.

The reduction of the leakage current across the diode junction 34 results directly in an increase in the $R_oA$ product for the diode; $R_oA$ being the magnitude of the resistance measured across the junction times the area of the junction. This is an important feature, in that an ideal photodetecting diode is characterized essentially as a current source having a large internal impedance. Thus, as the effective resistance of the junction 34 is increased by the decrease in leakage current, the internal impedance of the equivalent diode current source is increased; thereby more closely approximating an ideal photodiode.

The inversion layer 24 acts in yet another way to increase the $R_oA$ product. As is well known, an inversion layer within the surface of a p-type semiconductor is essentially an n-type layer. In the present invention, the inversion layer 24 acts to enlarge the n-type capping layer 18, thus creating a larger p-n diode junction 34. As the diode junction area increases, the $R_oA$ product likewise increases.

The aforesaid increase in junction area acts additionally to improve the conversion efficiency of the diode. Conversion efficiency is a measure of the capture of photocarriers which produce the diode current. The larger the area of junction 34 the greater will be the probability that a photocarrier will be captured. Thus, in the invention, the enlarged junction 34 increases the probability that a photon of incident radiation will be detected.

The invention yields a diode with a greater conversion efficiency in yet another way. Layer 14 acts to repel photocarriers from crossing the interface between layer 14 and base layer 12. Thus photocarriers remain within the base layer 16 of the array 10 wherein there is a higher probability that they will be captured.

Another benefit conferred by the inversion layer 24 is that the reverse breakdown characteristic of the diode is improved. Inasmuch as the readout device 28 is typically an integrated circuit multiplexer, the typical mode of operation of such a multiplexer circuit requires that each diode be maintained in a reversed bias state. Thus, the invention provides a diode which is better suited for operation with such a multiplexer readout device.

The physical characteristics of the mesa structure employed by the invention provides still further advantages over prior art photodiode arrays. Since the grooves 32 extend below the radiation absorbing layer 16 and the inversion layer 24, the photocariers cannot readily move to neighboring diodes. Also, the physical removal, by the etching process, of radiation absorbing semiconductor material between diodes ensures that no photocarriers can be generated in this region. Thus, the aforementioned problem of crosstalk between neighboring diodes is greatly reduced, thereby significantly improving the clarity and sharpness of the image seen by the array.

Another advantage of the array structure as provided by the invention is that the buffer layer 14, being of relatively high doping, provides for a uniform low resistance contact for all of the individual diode elements, thus reducing the series resistance associated with each diode and thereby increasing the diode conversion efficiency.

One still further advantage to be gained from a diode array constructed in accordance with the invention is a reduced susceptability to damage from high energy radiation such as gamma rays or X-rays. The inversion layer 24 created by the fixed positive charge within passivation 22 reduces the sensitivity of the inverted surface to changes caused by such high energy radiation.

It is to be understood that the above described embodiment of the invention is illustrative only, and that modifications thereof may occur to those skilled in the art. One such modification may be accomplished by doping the buffer and base layers of the array with an n-type dopant, and the capping layer with a p-type dopant. The passivation layer would therefore be required to contain a fixed negative change in order to induce an inversion layer within the base layer. Accordingly, this invention is not to be regarded as limited to the embodiment disclosed herein, but is to be limited only as defined by the appended claims.

What is claimed is:

1. A photodiode assembly for detecting radiation incident at a bottom side of said assembly comprising:
   an array of photodiodes;
   a common substrate disposed at said bottom side and supporting said array of photodiodes;
   a semiconducting buffer layer disposed on said substrate and extending beneath said array of photodiodes, said substrate and said buffer layer being transparent to said radiation, said substrate being an electrical insulator, said buffer layer being doped for electrical conductivity and serving as a common terminal to said photodiodes;

and wherein each of said photodiodes comprises:

a semiconductor base layer doped for electrical coonductivity, said base layer being disposed on said buffer layer for interaction with said radiation to produce electric charge carriers;

a capping layer doped with opposite electrical-conductivity dopant from said base layer to provide a p-n junction at an interface between said base layer and said capping layer, said p-n junction allowing for a flow of current of said charge carriers;

an electric terminal disposed on said capping layer;

and wherein said assembly further comprises an electrically-charged electrically-insulating passivation layer covering each of said photodiodes and extending downward through said capping layer and said base layer into said buffer layer around each photodiode to electrically isolate currents of respective ones of said photodiodes, said charged passivation layer inducing an inversion layer in said base layer in each of said photodiodes along an interface with said passivation layer for extension of said p-n junction and increased photon collection efficiency of a photodiode, the doping of said buffer layer being sufficiently larger than the doping of said base layer to inhibit formation of the inversion layer along an interface between said passivation layer and said buffer layer.

2. A photodiode assembly according to claim 1 wherein said buffer layer, said base layer, and said capping layer comprise mercury-cadmium-telluride.

3. A photodiode assembly according to claim 2 wherein the ratio of mercury to cadmium in said buffer layer is selected to provide transparency to infrared radiation.

4. A photodiode assembly according to claim 3 wherein the ratio of mercury to cadmium is the same in said base layer and in said capping layer, and is selected to provide a narrower energy gap than is present in said buffer layer, the energy gap in said base layer and in said capping layer providing for interaction with infrared radiation to produce said charge carriers.

5. A photodiode assembly according to claim 4 wherein said passivation layer is silicon dioxide.

6. A photodiode assembly according to claim 5 wherein said buffer and said base layers have p-type conductivity, and said capping layer has n-type conductivity.

7. A photodiode assembly according to claim 6 wherein the concentration of acceptor atoms in said buffer layer is approximately $1 \times 10^{16}$ per cubic centimeter.

8. A photodiode assembly according to claim 7 wherein the concentration of acceptor atoms in said base layer is approximating one-half that of said buffer layer.

9. A photodiode assembly according to claim 8 wherein the concentration of donor atoms in said capping layer is approximately 50% greater than the dopant concentration of said buffer layer.

10. A photodiode assembly according to claim 9 wherein said substrate comprises cadmium-telluride.

11. A photodiode assembly according to claim 9 wherein said substrate comprises cadmium-zinc-telluride.

12. A semiconductor photodiode imaging array comprising:

an insulating substrate transparent to radiation to be detected by said array incident upon a lower surface of said substrate;

a first electrically conducting mercury-cadmium-telluride layer with a first p-type impurity concentration overlying said substrate, said first layer being transparent to said radiation;

a second electrically conducting mercury-cadmium-telluride layer with a second p-type impurity concentration overlying said first layer, said second layer having a ratio of mercury to cadmium suitable for absorbing said radiation whereupon a proportional number of photocarriers are generated;

a third electrically conducting mercury-cadmium-telluride layer with an n-type impurity concentration overlying said second layer, whereupon the interface of said second and third layers forms a p-n junction;

a first plurality of grooves disposed parallel to one another and extending downward through said third and second layers, and partially through said first layer, thereby exposing respective cross-sections of said first, second, and third layers;

a second plurality of grooves disposed parallel to one another and orthogonal to said first grooves, said second grooves extending downward through said third and second layers, and partially through said first layer thereby exposing respective cross-sections of said first, said second, and said third layers; said first and said second grooves defining a plurality of mesa regions, each of said mesa regions having a top surface and four outwardly sloping side surfaces, each of said mesa regions containing respective portions of said first, said second, and said third layers which form a photodiode;

an area of first contact metalization formed upon said top surface of each of said mesas, said metalization being suitable for connecting each of said photodiodes to a readout device;

a layer of insulating passivation overlying said top and side surfaces of each of said mesa regions, said passivation layer having a positive charge; and an area of second contact metalization formed upon a portion of said first layer, said second contact metalization being suitable for connecting said first layer to said readout device, said second contact metalization forming a common electrical connection to said photodiodes through said first layer.

13. A semiconductor photodiode imaging array as defined in claim 12 wherein said first layer is doped with a greater concentration of said p-type impurity than said second layer.

14. A semiconductor photodiode imaging array as defined in claim 13 wherein said positive charge within said layer of passivation induces an inversion layer within surfaces of said second layer contiguous said passivation layer along said grooves, and wherein said inversion layer is in electrical contact with said third layer whereby said p-n junction is enlarged by an amount equal to the surface area of said inversion layer.

15. A semiconductor photodiode imaging array as defined in claim 14 wherein said first p-type concentration is of a magnitude such that the surface of said first layer underlying said fixed positive charge within said layer of passivation remains as p-type material, and said enlarged p-n junction contained within each of said mesa regions is electrically isolated from the enlarged p-n junctions within each of the other of said mesa regions.

16. A semiconductor photodiode imaging array as defined in claim 15 wherein said substrate comprises cadmium-telluride.

17. A semiconductor photodiode imaging array as defined in claim 15 wherein said substrate comprises cadmium-zinc-telluride.

* * * * *